United States Patent [19]

Buchheit

[11] 4,149,119

[45] Apr. 10, 1979

[54] COMBINED AC-DC ELECTROMETER WITH AC FEEDBACK FOR DRIFT COMPENSATION

[75] Inventor: Robert F. Buchheit, Pittsford, N.Y.

[73] Assignee: Xerox Corporation, Stamford, Conn.

[21] Appl. No.: 799,051

[22] Filed: May 20, 1977

[51] Int. Cl.² .......................................... G01R 5/28
[52] U.S. Cl. ........................................ 324/32; 330/9
[58] Field of Search ............... 324/32, 72, 72.5, 109; 330/9, 10

[56] References Cited

U.S. PATENT DOCUMENTS

| | | | |
|---|---|---|---|
| 2,714,136 | 7/1955 | Greenwood, Jr. | 330/9 |
| 2,741,668 | 4/1956 | Iffland | 330/9 |
| 3,852,667 | 12/1974 | Williams et al. | 324/72 |

OTHER PUBLICATIONS

Scherbatskoy et al., The Capacitive Commutator; Rev. of Scien. Ins., vol. 18, No. 6, Jun. 1947, pp. 415-421.

*Primary Examiner*—Robert J. Corcoran
*Attorney, Agent, or Firm*—Michael H. Shanahan

[57] ABSTRACT

An electrostatic voltmeter or electrometer which includes a probe sensor element for receiving electrostatic charge from a test surface whose potential level is desired to be measured. The probe is conditioned to receive both A.C. and D.C. signals which are amplified by a D.C. amplifier, with the A.C. signal from the probe being fed back to the D.C. amplifier to stabilize its output. In a preferred embodiment, a portion of the probe sensor element is periodically exposed to the test surface to impress the A.C. signal thereon which is utilized to correct the drift in the D.C. amplifier output.

5 Claims, 4 Drawing Figures

COMBINED AC-DC ELECTROMETER WITH AC FEEDBACK FOR DRIFT COMPENSATION

BACKGROUND OF THE INVENTION

This invention relates to apparatus for measuring electrostatic charge levels. More particularly, it involves an improvement in an electrostatic voltmeter, more commonly referred to as an electrometer.

Electrometers have been used in a wide variety of applications. They have found increasing use in the xerographic process wherein copies are formed from a latent electrostatic image on a charged photoreceptor. Satisfactory operation of the highly complex and sophisticated present day reproduction machine depends to a great degree on the ability to adjust the machine components for optimum performance. The electrometer, which has the capability of measuring electrostatic charge levels on the machine photoreceptor without touching its surface, is used to read the charge on the photoreceptor. On the basis of such reading, service personnel or automatic control circuitry can accurately adjust certain components affecting the charge level on the photoreceptor, e.g., the charging corotron, exposure duration, and developer bias, etc.

Currently available electrometers are either of the alternating current (A.C.) type or direct current (D.C.) type. In an A.C. type, an alternating signal is generated by the probe sensor element which views the test surface. This type of signal may be created, for example, by a rotating shutter or vane designed to periodically expose the test surface being measured to the entire probe element. The resulting A.C. signal is then processed to provide an appropriate readout. Unfortunately, known A.C. electrometers have a slow response time which can be extremely detrimental especially when automatic control of the machine components is employed, e.g. under microprocessor control.

In the D.C. electrometer, the probe sensor element is continuously exposed to the test surface. Hence, a D.C. signal is impressed on the sensor element which is amplified by a direct current amplifier. The output of the D.C. amplifier is then similarly processed to provide a readable output voltage, for example, by a voltmeter. The D.C. electrometers have considerably better speed of response than the A.C. electrometers. However, its output is subject to a phenomena known to those skilled in the art as "drift", which is due to the change in the balance of electronic components, etc. Since the output of the D.C. electrometers does not remain constant, an accurate reading of the electrostatic charge level on the test surface is difficult to measure over a significant period of time.

OBJECTS AND SUMMARY OF THE INVENTION

Therefore, it is the principle object of this invention to provide an electrometer having a fast response time, while also providing a constant output over a relatively long period of time.

This and other objects of this invention is accomplished by conditioning the probe to receive both D.C. and A.C. signals from the test surface. In a preferred embodiment, one portion of the probe sensor rod is continually exposed to the test surface, while another portion is only periodically exposed to the surface. Therefore, both an A.C. and D.C. type signal is impressed upon the sensor element. These signals are amplified through a D.C. amplifier, while the A.C. component is fed back to the D.C. amplifier after amplification by an A.C. amplifier. In such manner, the drift inherent in the D.C. amplifier is corrected by restoring its output to its original level via the amplified A.C. signal.

DESCRIPTION OF THE PREFERRED EMBODIMENT

Figure 1:
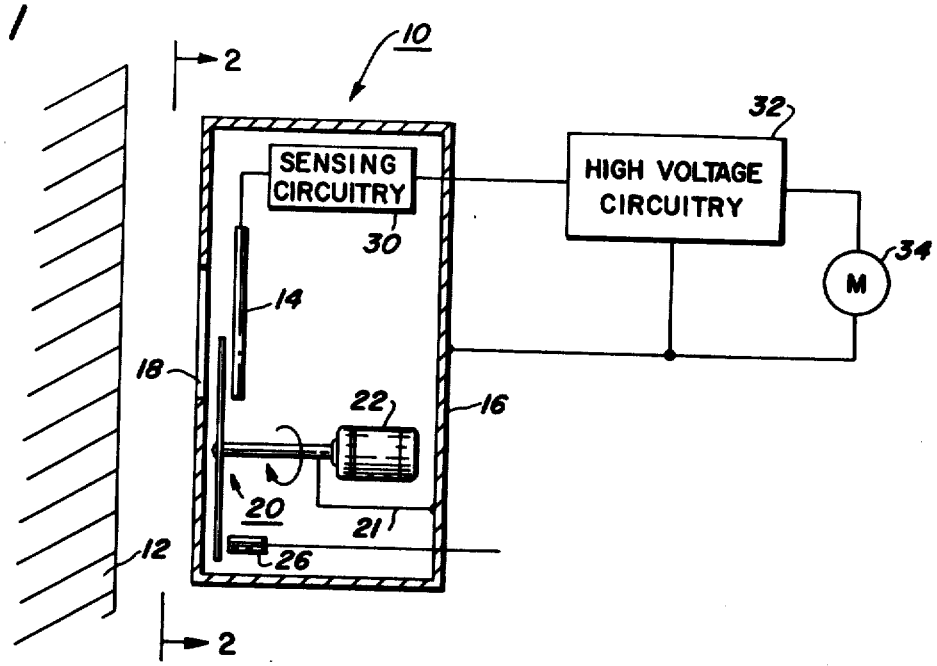
FIG. 1 is a schematic diagram showing one embodiment of the electrometer of the present invention adjacent to a test surface.
Figure 2:
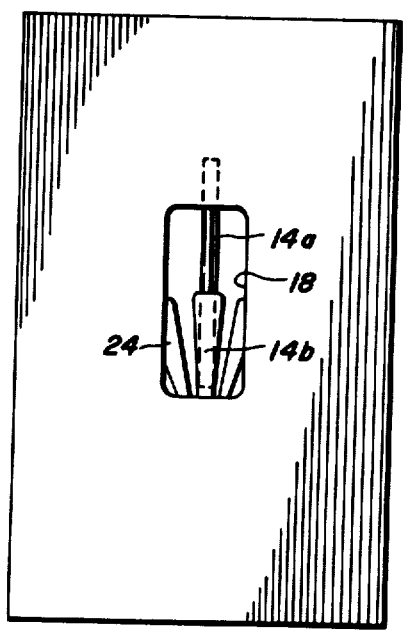
FIG. 2 is an exploded plan view along lines 2—2 of FIG. 1.

Referring now to FIGS. 1 and 2, there is shown an electrometer probe 10 for measuring electrostatic charge potentials on a test surface 12. Probe 10 includes a sensor element 14 within the confines of a surrounding housing 16. Probe 10 may comprise a conductive rod which is insulatingly mounted within a similarly conductive surrounding container forming a shield or housing for the probe. Other mechanical configurations can also be envisioned. Housing 16 includes an opening or window 18 therein in alignment with sensor element 14 as is most clearly shown in FIG. 2. A rotating vane or shutter 20 is disposed between lower portions 14b of sensor element 14 and window 18. Shutter 20 is merely exemplary of a variety of devices that can be used to periodically expose lower portions 14b of sensor element 14 to the test surface 12. For example, a vibrating member driven by an oscillating tuning fork (not shown) can also be employed. In this embodiment, shutter 20 is driven by a motor 22 which imparts a rotational movement to the radially extending finger members 24 of shutter 20. Shutter 20 is also electrically connected to housing 16 as schematically shown by line 21 so that finger members 24 are maintained at the same potential as housing 16 as will be later explained.

A conventional photocell-light emitting diode device 26 is utilized to sense the frequency of angular rotation of the shutter 20. For example, device 26 provides an output signal every time a finger member 24 is in alignment with the LED, with the finger member reflecting light rays from the LED back onto the photocell which provides a corresponding output to a demodulator as will be later explained.

When the probe 10 is brought into spaced relationship with the test surface 12, sensor element 14 receives charge eminating from surface 12 by capacitive coupling as is well known to those skilled in the art. Hence, a signal is impressed on the element 14 of a magnitude indicative of the quantative amount of charge on test surface 12. The signal from probe 14 is coupled to sensing circuitry 30 which amplifies the relatively small current signal which has been generated in the probe element 14. To provide a readable output as a measure of voltage, instead of current, the output of sensing circuitry 30 is coupled to high voltage circuitry 32. Various electrical circuitry can perform this function and forms no part of the present invention. It may consist of merely a resistive network in which a voltmeter 34 can measure the voltage drop developed by the amplified current signal from the probe element 14. However, more sophisticated circuitry can also be employed such as that described in U.S. Pat. No. 4,106,869, entitled "Distance Compensated Electrostatic Voltmeter" by Robert Buchheit, filed Nov. 26, 1976 and assigned to the same assignee as the present invention, which application is hereby incorporated by reference. In the high voltage circuitry disclosed therein, a voltage equivalent to that on the test surface 12 as sensed by the probe element 14 is fed back to the probe shield 16 as shown in FIG. 1. In such manner, the output reading of the electrometer is rendered substantially independent of the spacing between the probe 10 and test surface 12.

It is a feature of this invention that the probe signal has been conditioned to include both A.C. and D.C. components. The D.C. component is provided by the direct capacitve coupling between test surface 12 and the upper portion 14a of sensor element 14 which is continuously exposed to the test surface 12. In contrast, the lower sensor portion 14b is only periodically exposed to the test surface 12 since it is periodically being covered by the finger members 24 of shutter 20. Hence, an A.C. signal is also impressed on probe 14. Since shutter 20 is biased by high voltage circuitry 32, the only time an A.C. signal will be present on probe 14 is when the potential on the test surface 12 is different from that on the shutter 20.

Figure 3:
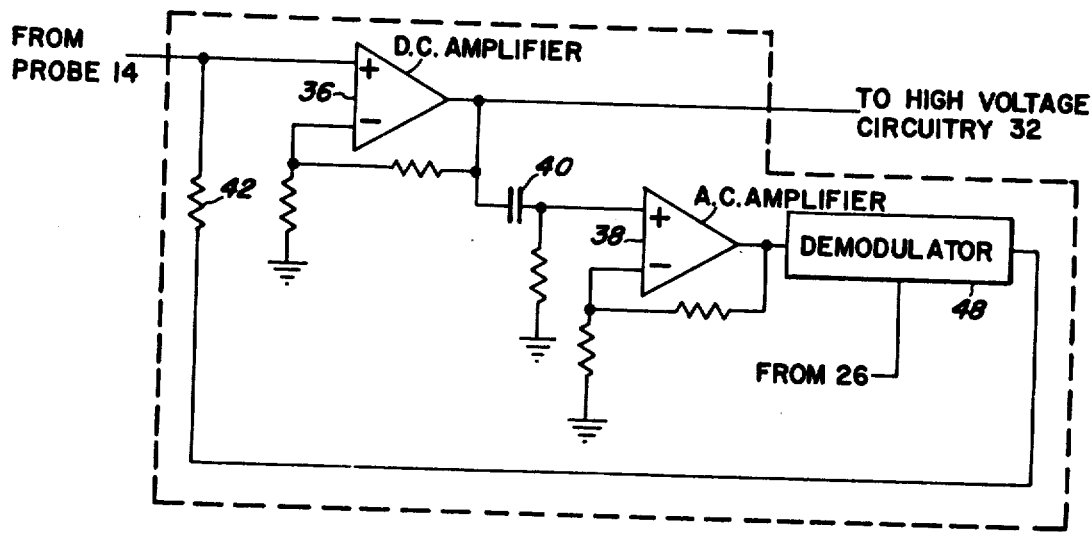
FIG. 3 is an electrical schematic diagram of the electrometer sensing circuitry as shown in FIG. 1.
Figure 4:
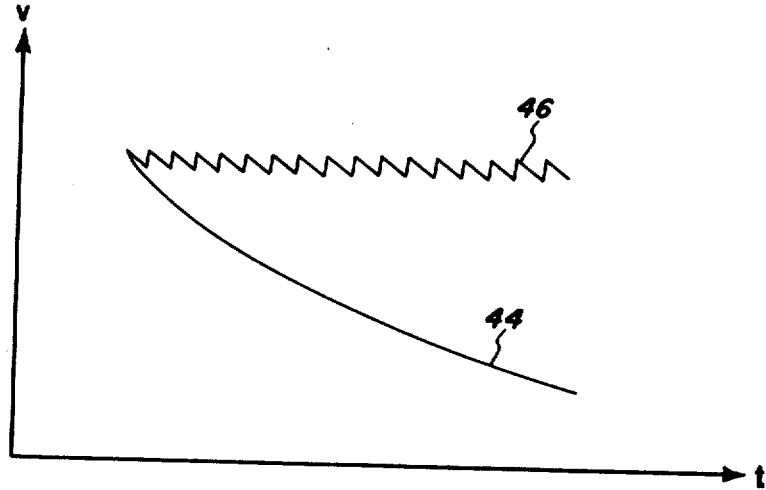
FIG. 4 is a graph illustrating the drift correction feature of the present invention as compared to the output of prior art D.C. electrometers.

Referring now to FIG. 3, the reader's attention is returned to the sensing circuitry 30 which is shown in more detail in this figure. It should be noted that sensing circuitry 30 can be conveniently placed within the confines of housing 16, whereas high voltage circuitry 32 may be external from the probe 10. Sensing circuitry 30 includes a D.C. amplifier 36 and an A.C. amplifier 38. Amplifiers 36 and 38 are commonly known components used in the art such as Model No. CA3140, manufactured by RCA Company. It will be remembered that the signal from probe element 14 may contain both a D.C. component and an A.C. component. The D.C. amplifier 36 amplifies both the A.C. and D.C. components of the signal. However, A.C. amplifier 38 will amplify only the A.C. component, if present, since the D.C. component is filtered out by blocking capacitor 40. In the prior art D.C. electrometers, the output of the D.C. amplifier is subject to drift, for example, as exemplified by plot 44 of FIG. 4. Plot 44, although somewhat exaggerated for purposes of illustration, shows that the original output of the prior art D.C. electrometers is not constant but varies with respect to time. Hence, it can be seen that consistently accurate measurements cannot be made. However, through the use of the present invention, the electrometer provides consistently accurate readings as exemplified by plot 46 of FIG. 4.

This is accomplished by feeding back the amplified and demodulated A.C. component from the probe element 14 to the D.C. amplifier 36. The A.C. component signal is amplified by A.C. amplifier 38 and demodulated by a demodulator 48 to provide a positive or negative D.C. voltage level depending on the phase of the A.C. signal. Demodulator 48 is well known to those skilled in the art and in this embodiment is synchronized by the led/photocell device 26 to filter out extraneous frequencies. The output of demodulator 48 is coupled to the non-inverting input of D.C. amplifier 36 through resistor 42. In such manner a positive or negative current is coupled to the input of amplifier 36 depending upon whether the test surface 12 is above or below the potential on shutter 20 as sensed by probe portion 14b.

Assuming that the potential of test surface 12 is constant, such a differential is caused in prior art electrometers by the drift in the D.C. amplifier.

Hence, the internal A.C. feedback loop to the D.C. amplifier periodically boosts or restores the output of the D.C. amplifier to its original level by counteracting the undesirable drift currents generated by all the components coupled to the probe element 14. As illustrated by plot 46 of FIG. 4, this corrects for the drift problem encountered in prior art D.C. electrometers. However, as the high voltage circuitry 32 is driven by the output of the D.C. amplifier 36, the electrometer of the present invention still possesses excellent high speed response.

Therefore, while this invention has been described in connection with a particular embodiment thereof, no limitation is intended thereby except as defined in the appended claims.

What is claimed is:

1. Electrometer apparatus for developing electric signals representative of charge on a test surface comprising a housing having a window positionable adjacent charge on a test surface, a probe fixedly located inside the housing aligned with the window for developing by capacitive coupling a DC signal at the probe representative of charge on a test surface, shutter means, electrically coupled to the housing, for periodically positioning a shield member between the window and a portion of the probe for developing an AC signal at the probe representative of the potential difference between the probe and the housing, sync means coupled to the shutter means for generating a synchronous signal representative of the periodic positioning of a shield member between the window and a portion of the probe, first amplifier means coupled to the probe for amplifying both the AC and DC signals developed at the probe, second amplifier means capacitively coupled to receive only the AC signal amplified by the first amplifier means for amplifying the AC signal and demodulator means coupled between the output of the second amplifier means and the input of the first amplfier means for demodulating the AC signal amplified by the second amplifier means in response to the synchronous signal for feeding back a compensation signal to the first amplifier means to compensate for electrical drift in the combined AC and DC signal amplified by the first amplifier means whereby the combined AC and DC signal amplified by the first amplifier means is representative of charge on a test surface.

2. Electrometer apparatus for developing electric signals representative of charge on a test surface comprising a housing having a window positionable adjacent charge on a test surface, a probe fixedly located inside the housing aligned with the window for developing by capacitive coupling at the probe a DC signal representative of charge on a test surface, shutter means, electrically coupled to the housing, for positioning periodically a shield member between the window and a portion of the probe for developing at the probe an AC signal representative of the potential difference between the probe and the housing, sync means coupled to the shutter means for generating a synchronous signal representative of the periodic positioning of a shield member between the window and a portion of the probe, amplifier means including an input summing junction coupled to the probe for amplifying both the DC and AC signals developed at the probe and feedback means, responsive to the synchronous signal, for demodulating the amplified AC signal and feeding back to the input summing junction of the amplifier means a compensation signal to compensate for changes in the DC signal relative to the housing whereby the combined AC and DC signal amplified by the amplifier means represents charge on a test surface.

3. The apparatus of claim 1 further including high voltage circuit means coupled to receive said combined AC and DC signal amplified by the amplifier means and meter means coupled to the high voltage circuit means for indicating the level of charge on a test surface.

4. The apparatus of claim 1 wherein said shutter means includes a rotary member having radial finger members that are the shield members passed between the window and probe upon rotation of the rotary member.

5. The apparatus of claim 1 wherein said shield member is coupled to a tuning fork vibrator means for periodically positioning the shield member between the window and the probe.

* * * * *